United States Patent
Batutis et al.

(10) Patent No.: US 11,456,043 B2
(45) Date of Patent: Sep. 27, 2022

(54) SELECT GATE MAINTENANCE IN A MEMORY SUB-SYSTEM

(71) Applicant: Micron Technology, Inc., Boise, ID (US)

(72) Inventors: Devin M. Batutis, San Jose, CA (US); Avinash Rajagiri, Boise, ID (US); Sheng-Huang Lee, Meridian, ID (US); Chun Sum Yeung, San Jose, CA (US); Harish R. Singidi, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/301,743

(22) Filed: Apr. 13, 2021

(65) Prior Publication Data

US 2021/0233594 A1     Jul. 29, 2021

Related U.S. Application Data

(63) Continuation of application No. 16/798,832, filed on Feb. 24, 2020, now Pat. No. 11,017,870.

(60) Provisional application No. 62/952,832, filed on Dec. 23, 2019.

(51) Int. Cl.
*G11C 11/56* (2006.01)
*G11C 16/34* (2006.01)
*G11C 16/10* (2006.01)
*G11C 16/26* (2006.01)

(52) U.S. Cl.
CPC ........... *G11C 16/349* (2013.01); *G11C 16/10* (2013.01); *G11C 16/26* (2013.01)

(58) Field of Classification Search
CPC ..................................................... G11C 11/56
USPC ..................................................... 365/185.24
See application file for complete search history.

(56) References Cited

U.S. PATENT DOCUMENTS

2013/0117500 A1* 5/2013 Joo ............... G11C 13/0007
711/E12.008

* cited by examiner

*Primary Examiner* — Jason Lappas
(74) *Attorney, Agent, or Firm* — Lowenstein Sandler LLP (57) ABSTRACT

A processing device in a memory system receives a request to erase a data block of a memory device, determines a number of program/erase cycles performed on the data block, and performs an erase operation to erase the data block. The processing device further determines that the number of program/erase cycles performed on the data block satisfies a scan threshold condition and performs a first threshold voltage integrity scan on the data block to determine a first error rate associated with a current threshold voltage of at least one select gate device of the data block. Responsive to the first error rate associated with the current threshold voltage of the at least one select gate device satisfying an error threshold criterion, the processing device performs a touch up operation on the at least one select gate device to adjust the current threshold voltage to the target threshold voltage.

20 Claims, 5 Drawing Sheets

SELECT GATE MAINTENANCE IN A MEMORY SUB-SYSTEM

RELATED APPLICATIONS

This application is a continuation of U.S. patent application Ser. No. 16/798,832, filed Feb. 24, 2020, which claims the benefit of U.S. Provisional Application No. 62/952,832, filed Dec. 23, 2019, the entire contents of which are hereby incorporated by reference herein.

TECHNICAL FIELD

Embodiments of the disclosure relate generally to memory sub-systems, and more specifically, relate to select gate maintenance in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to select gate maintenance in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. A non-volatile memory device is a package of one or more dice. Each die can consist of one or more planes. Planes can be grouped into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A data block hereinafter refers to a unit of the memory device used to store data and can include a group of memory cells, a word line group, a word line, or individual memory cells. Memory pages (also referred to herein as "pages") store one or more bits of binary data corresponding to data received from the host system. The memory cells of a data block can be arranged along a number of separate wordlines. Each data block can include a number of sub-blocks, where each sub-block is defined by an associated pillar (e.g., a vertical conductive trace) extending from a shared bitline. Since the sub-blocks can be accessed separately (e.g., to perform program or read operations), the data block can include a structure to selectively enable the pillar associated with a certain sub-block, while disabling the pillars associated with other sub-blocks. In one embodiment, this structure includes one or more select gate devices positioned at either or both ends of each pillar. Depending on a control signal applied, these select gate devices can either enable or disable the conduction of signals through the pillars. In one embodiment, the select gates devices associated with each pillar in the data block are controlled separately.

Conventional memory devices can implement these select gate devices using floating gate transistors having a relatively long channel that provides good signal isolation when in the appropriate state. Other memory devices, however, can implement these select gate devices using replacement gate transistors which have a relatively short channel. The replacement gate transistors are programmable devices and thus offer the benefit of more versatility, but are susceptible to some amount of signal leakage. In addition, the programmable threshold voltage of replacement gate transistors can shift over time. While initially set at a certain target value, numerous factors including a number of program/erase cycles performed on the device, temperature changes, etc. can cause the threshold voltage of the select gate device to increase or decrease over time. This shift away from the target value can lead to charge loss causing the select gate device to function improperly, and potentially causing reliability problems in the data stored on the wordlines of the corresponding sub-block.

Aspects of the present disclosure address the above and other deficiencies by periodically performing maintenance operations on the select gate devices to adjust the current threshold voltage of those select gate devices (which can have shifted over time) back to a target threshold voltage. In one embodiment, in response to a request to erase a given data block or a request to invalidate the data block, a memory sub-system controller determines a number of program/erase cycles performed on the data block and determines whether the number of program/erase cycles satisfies a scan threshold condition. In response to the number of program/erase cycles satisfying the scan threshold condition, the memory sub-system controller can perform a threshold voltage integrity scan on the data block to determine an error rate associated with the current threshold voltage of at least one select gate device of the data block. If the first error rate associated with the current threshold voltage of at least one select gate device satisfies an error threshold criterion, the memory sub-system controller can perform a touch up program operation on at least one select gate device to adjust the current threshold voltage back to the target threshold voltage. In another embodiment, the memory sub-system controller can blindly perform the touch up operation without first performing the threshold voltage integrity scan if the number of program/erase cycles performed on the data block satisfies a separate threshold condition (e.g., a higher number of program erase/cycles).

Periodically performing touch up operations on the select gate devices ensures that the threshold voltages of the select gate devices in a data block do not shift too far away from the target threshold voltage at which the select gate devices are designed to operate. This causes the select gate devices to be enabled and disabled correctly in response to receiving corresponding control signals. This improves the integrity of data stored in the sub-blocks controlled by each respective select gate device, as data operations (e.g., program or read operations) can be focused on an intended sub-block without causing unwanted effects on the other sub-blocks of the data block. In addition, the threshold voltage of a select gate device can be corrected before shifting so far away from the target voltage that the select gate becomes unrepairable, and preventing the need to retire the data block entirely. Thus, the touch up operations described herein can maintain the expected capacity and improve the lifespan of the memory device.

Figure 1:
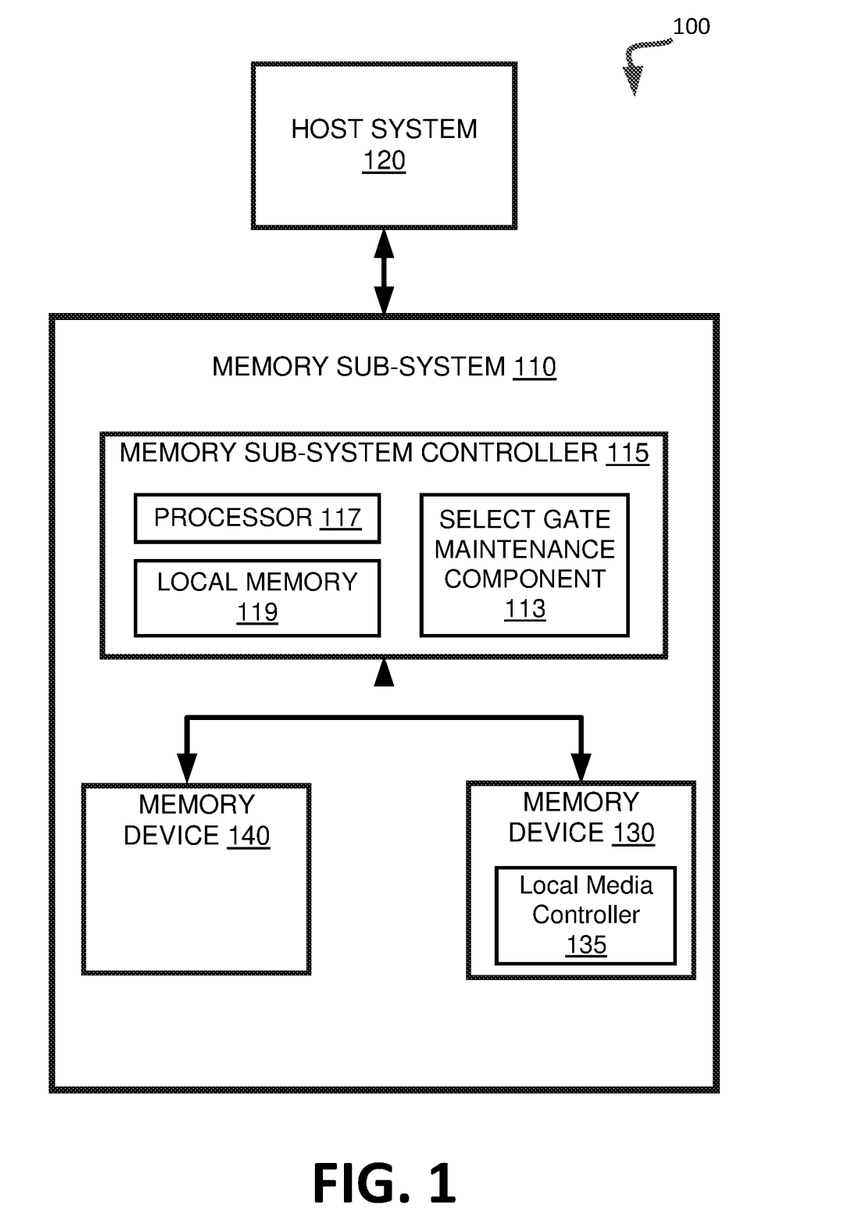
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

In one embodiment, the memory sub-system 110 includes a select gate maintenance component 113 that can be used to periodically perform maintenance operations on select gate devices of a data block of memory device 130 or memory device 140. In one embodiment, the maintenance operations include a touch up operation where select gate maintenance component 113 iteratively applies a series of program pulses to a select gate device to adjust a current threshold voltage of the select gate device back to a target threshold voltage, and verifying, after each iteration, whether the current threshold voltage has reached the target threshold voltage. In one embodiment, in response to a request to erase a given data block or a request to invalidate the data block, select gate maintenance component 113 determines a number of program/erase cycles performed on the data block and determines whether the number of program/erase cycles satisfies a scan threshold condition. In response to the number of program/erase cycles satisfying the scan threshold condition, select gate maintenance component 113 can perform a threshold voltage integrity scan on the data block to determine an error rate associated with the current threshold voltage of at least one select gate device of the data block. If the first error rate associated with the current threshold voltage of the at least one select gate device satisfies an error threshold criterion, select gate maintenance component 113 can perform a touch up operation on at least one select gate device to adjust the current threshold voltage back to the target threshold voltage. In another embodiment, select gate maintenance component 113 can blindly perform the touch up operation without first performing the threshold voltage integrity scan if the number of program/erase cycles is sufficiently high. Further details with regards to the operations of the select gate maintenance component 113 are described below.

Figure 2:
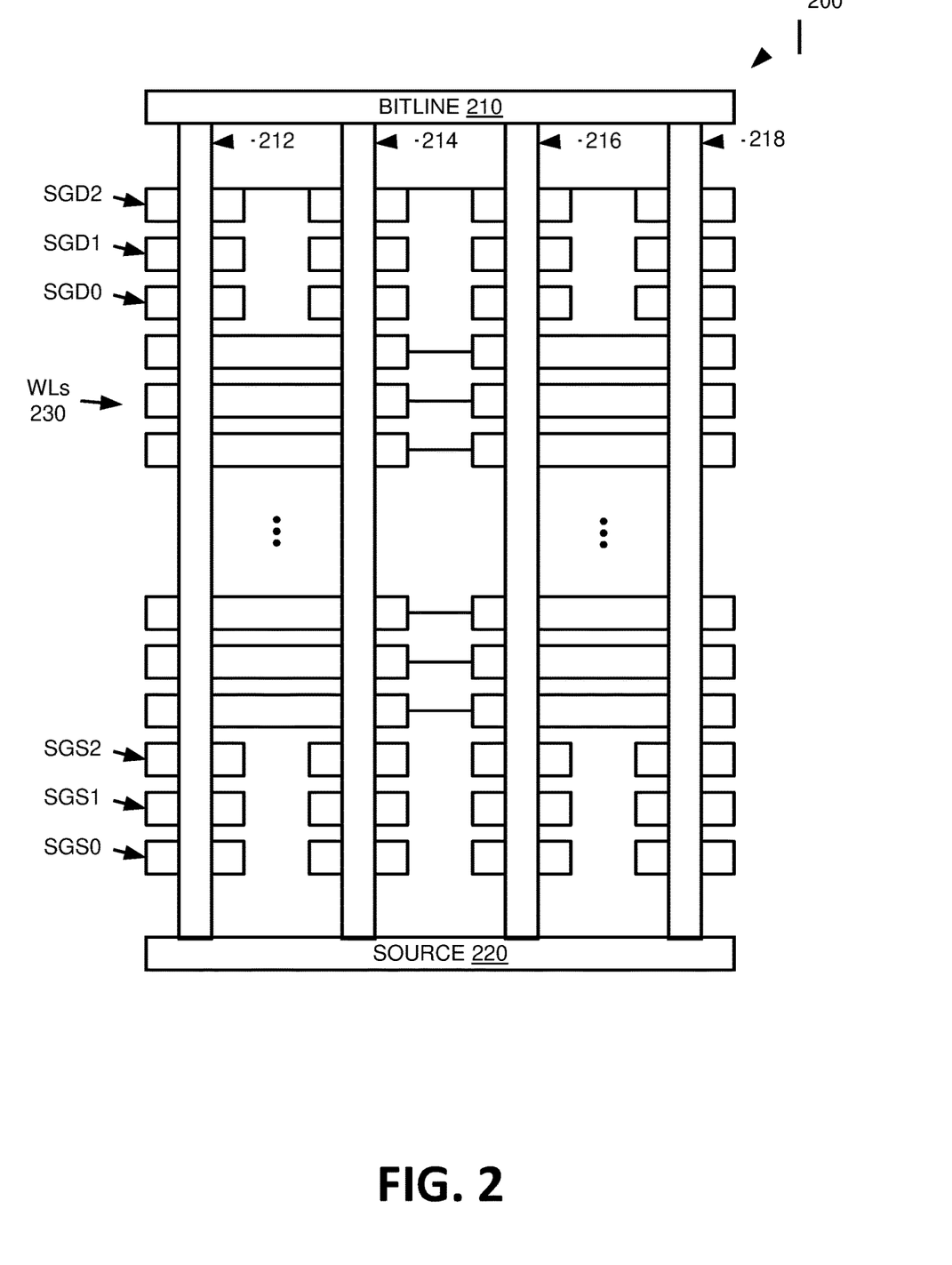
FIG. 2 is a block diagram illustrating select gate devices in a data block of a memory device in a memory sub-system in accordance with some embodiments of the present disclosure.

FIG. 2 is a block diagram illustrating select gate devices in a data block of a memory device in a memory sub-system in accordance with some embodiments of the present disclosure. In one embodiment, data block 200 is representative of any of the data blocks that make up memory device 130 or memory device 140. Data block 200 can be one of a number of physical blocks in the memory device can include a set of memory pages. The memory pages store one or more bits of binary data corresponding to data received from the host system. The memory cells of data block 200 can be arranged along a number of separate wordlines 230. Data block 200 can include a shared bitline 210 having a number of pillars 212, 214, 216, 218 extending therefrom to a separate source line 220. Each pillar can be a vertical conductive trace and the intersections of each of pillars 212, 214, 216, 218 and of each of wordlines 230 form the memory cells. Thus, each of pillars 212, 214, 216, 218 forms a separate sub-block within data block 200, where each sub-block can be accessed separately. To enable an access operation, such as a program operation or a read operation, to be performed on a given sub-block, data block 200 includes a number of select gate devices to selectively enable the pillar (e.g., pillar 212) associated with a certain sub-block, while disabling the pillars (e.g., pillars 214, 216, 218) associated with other sub-blocks. For example, each pillar can include a number of select gate devices (e.g., SGD0, SGD1, SGD2) at a first end (e.g., a drain end) and a number of select gate devices (e.g., SGS0, SGS1, SGS2) at a second end (e.g., a source end).

In one embodiment, the select gate devices in data block 200 are formed using programmable replacement gate transistors. Thus, the select gate devices have a programmed threshold voltage. Depending on a magnitude of a control signal applied relative to the threshold voltage, the select gate devices can either enable or disable the conduction of signals through the corresponding pillar. For example, if the magnitude of the control signal applied to a select gate device is less than the threshold voltage, the select gate device can be turned off and can prevent signal flow through the corresponding pillar. Conversely, if the magnitude of the control signal is greater than the threshold voltage, the select gate device can be turned on and can permit signal flow through the corresponding pillar. In one embodiment, the select gates devices associated with each pillar in data block 200 are controlled separately, such that signal flow can be prevented in certain pillars while permitted in other pillars at the same time. Replacement gate transistors have a relatively short internal channel length, and thus are susceptible to some amount of signal leakage. Accordingly, in one embodiment, each pillar in data block 200 has multiple select gate devices at each of the drain end and the source end, effectively increasing the internal channel length to provide better signal isolation when turned off.

The programmable threshold voltage of the select gate devices can shift over time. While initially set at a certain target value, numerous factors such as, a number of program/erase cycles performed on the device, changes in temperature, etc. can cause the threshold voltage of a select gate device to increase or decrease over time. This shift away from the target value can lead to charge loss causing the select gate device to function improperly, and potentially causing reliability problems in the data stored on the wordlines 230 of the corresponding sub-block. Accordingly, in one embodiment, select gate maintenance component 113 can periodically perform maintenance operations on select gate devices SGD0, SGD1, SGD2 or SGS0, SGS1, SGS2 of data block 200. In one embodiment, the maintenance operations include a touch up operation where select gate maintenance component 113 iteratively applies a series of program pulses to a select gate device to adjust a current threshold voltage of the select gate device back to a target threshold voltage, and verifying, after each iteration, whether the current threshold voltage has reached the target threshold voltage. Upon being returned to the target threshold voltage, the select gate device can function properly, such that it will turn on or off correctly in response to receiving a corresponding control signal.

Figure 3:
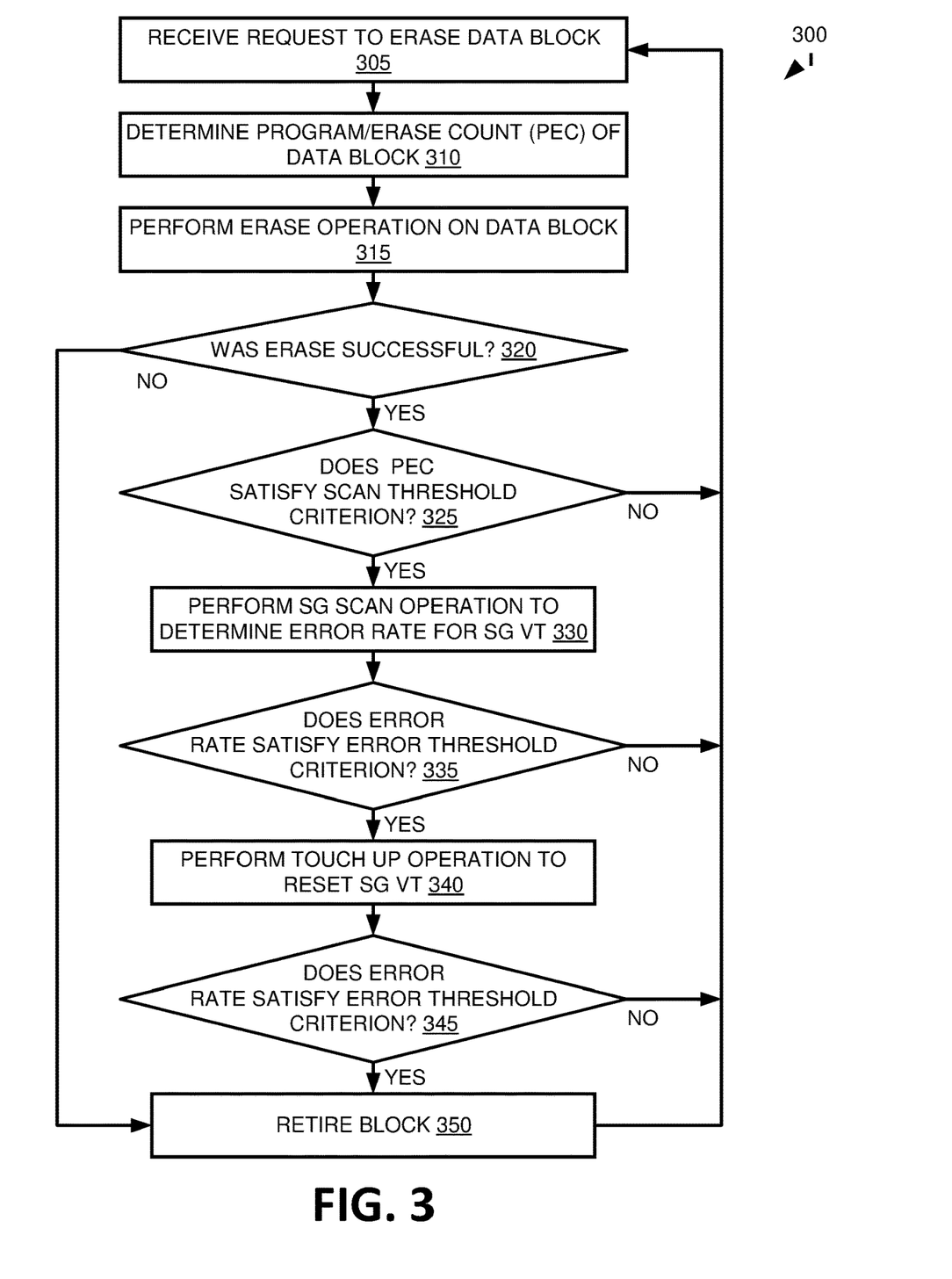
FIG. 3 is a flow diagram of an example method of performing select gate maintenance in a data block of a memory device in response to a block erase operation, in accordance with some embodiments of the present disclosure.

FIG. 3 is a flow diagram of an example method of performing select gate maintenance in a data block of a memory device in response to a block erase operation, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by select gate maintenance component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing logic receives a request to erase a data block 200 of the memory device 130. In one embodiment, memory sub-system controller 115 generates the request to erase the data block 200 in response to the performance of internal memory management operation (e.g., garbage collection). For example, if it is determined that data block 200 no longer contains any valid data, memory sub-system controller 115 can determine to erase the remaining invalid data on data block 200 so that data block can be repurposed for storing other data.

At operation 310, the processing logic determines a number of program/erase cycles performed on the data block 200 (i.e., a program/erase count (PEC)). A program/erase cycle can include data being programmed to data block 200 and subsequently, data block 200 being erased. This process can occur many times over the lifespan of the data block 200, as data blocks are continually repurposed in memory sub-system 110. In one embodiment, select gate maintenance component 113, or some other component in memory sub-system controller 115 maintains a counter to track the number of program/erase operations performed on data block 200. In one embodiment, the counter is maintained at the block level and is incremented each time a program/erase cycle is performed on data block 200. In one embodiment, the counter is initialized at an initial value (e.g., 0) and is incremented in response to the read operations. Accordingly, the value of the counter represents the current program/erase count of the data block 200.

At operation 315, the processing logic performs an erase operation to erase the data block 200 in response to the request. In one embodiment, memory sub-system controller 115 issues an erase command to memory device 130. In response, memory device 130 can erase the remaining invalid data in data block 200. At operation 320, the processing logic determines whether the data block 200 was successfully erased. In one embodiment, in response to issuing the erase command to memory device 130, memory sub-system controller 115 receives a confirmation message from memory device 130 indicating that data block 200 was erased. If memory sub-system controller 115 does not receive the confirmation message within a threshold period of time, memory sub-system controller 115 can determine that the erase operation was not successful. If the erase operation is not successful, processing can proceed to operation 350, where the processing logic retires data block 200.

If the data block was successfully erased, at operation 325, the processing logic determines whether the number of program/erase cycles performed on the data block 200 satisfies a scan threshold condition. In one embodiment, select gate maintenance component 113 compares the number of program/erase cycles determined at operation 310 to a scan threshold value. The scan threshold value can be dependent on how memory block is configured (e.g., as SLC memory, MLC memory, TLC memory, QLC memory). For example, the scan threshold value can be set, based on testing or other diagnostics, at a level when a select gate integrity scan is appropriate to determine an error level or other reliability metric of the select gate devices of data block 200. If the number of program/erase cycles does meet or exceed the scan threshold value, select gate maintenance component 113 can further determine whether the number of program/erase cycles is equal to a defined interval for the data block 200. The defined internal can represent some number of program/erase cycles above the scan threshold value, such that every time that number of program/erase cycles occurs, a select gate integrity scan can be performed. For example, if the scan threshold value is 2000 cycles and the defined internal is 100 cycles, select gate maintenance component 113 can perform a select gate integrity scan every 100 cycles above 2000 (i.e., 2100, 2200, 2300, etc.). Thus, in one embodiment, the scan threshold condition is satisfied when the program/erase cycles meet or exceed the scan threshold value and is equal to the defined interval. If the number of program/erase cycles does not meet or exceed the scan threshold value or does not equal the defined interval, the processing logic determines that the scan threshold criterion is not satisfied, returns to operation 305, and waits to receive another request to erase the data block 200.

If the number of program/erase cycles performed on the data block 200 satisfies the scan threshold condition, at operation 330, the processing logic performs a first threshold voltage integrity scan on the data block 200 to determine a first error rate associated with a current threshold voltage of at least one select gate device SGD0 of the data block 200. During the scan, select gate maintenance component 113 identifies one or more reliability statistics, such as the raw bit error rate (RBER) representing a number of bit errors per total number of bits that the select gate experiences. In one embodiment, during the scan, select gate maintenance component 113 applies one or more read voltages to the select gate device SGD0 and receives one or more output values based on the one or more read voltages. For example, select gate maintenance component 113 reads a raw code word (i.e., a series of a fixed number of bits) from the select gate device SGD0, applies the code word to an error correcting code (ECC) decoder to generate a decoded code word, and compare the decoded code word to the raw code word (i.e., the expected output value). Select gate maintenance component 113 can count a number of flipped bits between the decoded code word and the raw code word, with a ratio of the number of flipped bits to the total number of bits in the code word representing the RBER. Select gate maintenance component 113 can repeat this process for additional code words until each of the select gate devices in data block 200 have been scanned.

At operation 335, the processing logic determines whether the first error rate associated with the current threshold voltage of the at least one select gate device SGD0 satisfies an error threshold criterion. In one embodiment, select gate maintenance component 113 compares the first error rate to an error threshold which represents an error correction capability of the memory device. If the first error rate does not meet or exceed the error threshold, the processing logic determines that the error threshold criterion is not satisfied and returns to operation 305. If, however, the first error rate does meet or exceed the error threshold, the processing logic determines that the error threshold criterion is satisfied.

In one embodiment, select gate maintenance component 113 examines the first error rate to determine whether the current threshold voltage has decreased below the target threshold voltage or increased above the target threshold voltage. In one embodiment, if the current threshold voltage has decreased below the target threshold voltage, select gate maintenance component 113 can perform a touch up operation to increase the current target threshold voltage to the target threshold voltage. In one embodiment, select gate maintenance component 113 performs a single scan to determine if the current threshold voltage has decreased below the target threshold voltage (e.g., to identify a "lower tail") or has increased above the target threshold voltage (e.g., to identify an "upper tail"). In another embodiment, separate scans can be performed. For example, select gate maintenance component 113 can perform a second scan to determine whether the current threshold voltage has increased above the target threshold voltage. If the current threshold voltage has increased above the target threshold voltage, select gate maintenance component 113 can retire the data block 200.

If the first error rate associated with the current threshold voltage of the at least one select gate device SGD0 satisfies the error threshold criterion, at operation 340, the processing logic performs a touch up operation on the at least one select gate device SGD0 to adjust the current threshold voltage to the target threshold voltage. In one embodiment, select gate maintenance component 113 iteratively applies a plurality of program pulses to at least one select gate device SGD0, to a subset of the select gate devices of data block 200, or to all of the select gate devices of data block 200, to adjust the current threshold voltage of the select gate device(s) back to the target threshold voltage. Select gate maintenance component 113 can verify, after each iteration, whether the current threshold voltage has reached the target threshold voltage, to ensure that the threshold voltage slowly steps back up to the target threshold voltage, without exceeding the target threshold voltage.

At operation 345, the processing logic performs a second threshold voltage integrity scan on the data block to determine a second error rate associated with the current threshold voltage of the at least one select gate device SGD0 of the data block 200 after performing the touch up operation and determines whether the second error rate associated with the current threshold voltage of the at least one select gate device SGD0 after performing the touch up operation satisfies the error threshold criterion. If the second error rate associated with the current threshold voltage of the at least one select gate device SGD0 after performing the touch up operation satisfies the error threshold criterion, at operation 350, the processing logic retires the data block 200. In one embodiment, the memory sub-system controller 115 adds the data block 200 to a list of retired data blocks in order to prevent new data from being written to the data block 200 in the future. If the second error rate associated with the current threshold voltage of the at least one select gate device SGD0 after performing the touch up operation does not satisfy the error threshold criterion (i.e., the error rate is below the error threshold), the block is returned to a pool of available blocks, and processing logic returns to operation 305.

In one embodiment, select gate maintenance component 113 can blindly perform the touch up operation at operation 340 without first performing the threshold voltage integrity scan at operation 330. For example, select gate maintenance component 113 can compare the number of program/erase cycles determined at operation 310 to a second scan threshold value, which can be higher than the scan threshold value used at operation 325. This second higher scan threshold value can be set, based on testing or other diagnostics, at a level when a significant amount of shift in the threshold voltage of the select gate devices of the data block 200 is almost certain to have occurred. Accordingly, select gate maintenance component 113 can bypass the threshold voltage integrity scan and proceed directly to performing the touch up operation on the select gate devices. This can prevent the memory sub-system controller 115 from wasting power and bandwidth performing the scan.

Figure 4:
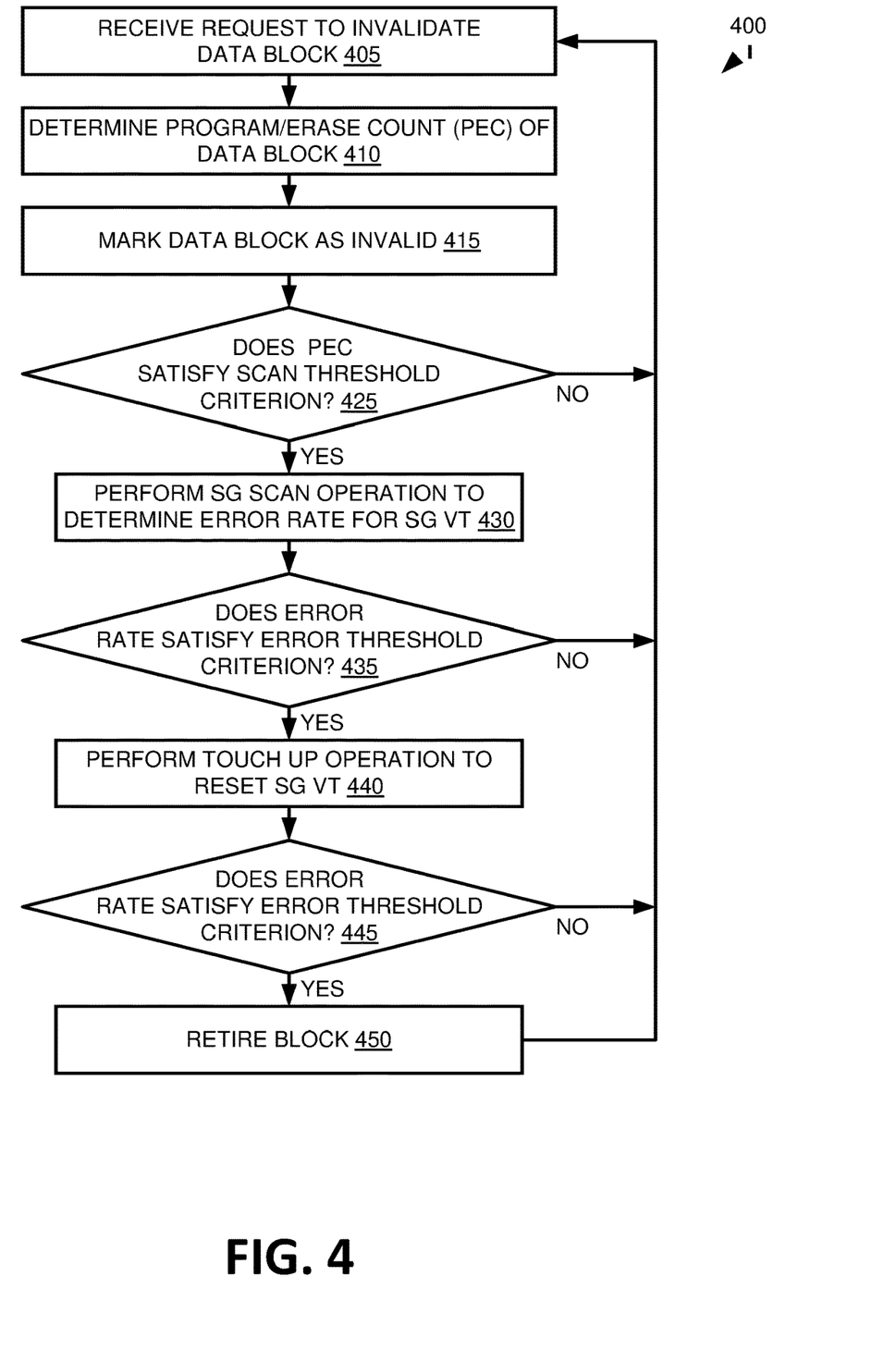
FIG. 4 is a flow diagram of an example method of performing select gate maintenance in a data block of a memory device in response to a block invalidation operation, in accordance with some embodiments of the present disclosure.

FIG. 4 is a flow diagram of an example method of performing select gate maintenance in a data block of a memory device in response to a block invalidation operation, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by select gate maintenance component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing logic receives a request to invalidate a data block 200 of the memory device 130. In one embodiment, memory sub-system controller 115 generates the request to invalidate the data block 200 in response to the performance of internal memory management operation (e.g., garbage collection). For example, if it is determined that data block 200 no longer contains any valid data, memory sub-system controller 115 can determine to invalidate the data block 200 so that data block can later be erased and repurposed for storing other data.

At operation 410, the processing logic determines a number of program/erase cycles performed on the data block 200 (i.e., a program/erase count (PEC)). A program/erase cycle can include data being programmed to data block 200 and subsequently, data block 200 being erased. This process can occur many times over the lifespan of the data block 200, as data blocks are continually repurposed in memory sub-system 110. In one embodiment, select gate maintenance component 113, or some other component in memory sub-system controller 115 maintains a counter to track the number of program/erase operations performed on data block 200. In one embodiment, the counter is maintained at the block level and is incremented each time a program/erase cycle is performed on data block 200. In one embodiment, the counter is initialized at an initial value (e.g., 0) and is incremented in response to the read operations. Accordingly, the value of the counter represents the current program/erase count of the data block 200.

At operation 415, the processing logic marks the data block as invalid. In one embodiment, memory sub-system controller 115 adds an identifier of the data block to a list of invalid data blocks. At operation 425, the processing logic determines whether the number of program/erase cycles performed on the data block 200 satisfies a scan threshold condition. In one embodiment, select gate maintenance component 113 compares the number of program/erase cycles determined at operation 410 to a scan threshold value. The scan threshold value can be dependent on how memory block is configured (e.g., as SLC memory, MLC memory, TLC memory, QLC memory). For example, the scan threshold value can be set, based on testing or other diagnostics, at a level when a select gate integrity scan is appropriate to determine an error level or other reliability metric of the select gate devices of data block 200. If the number of program/erase cycles does meet or exceed the scan threshold value, select gate maintenance component 113 can further determine whether the number of program/erase cycles is equal to a defined interval for the data block 200. The defined internal can represent some number of program/erase cycles above the scan threshold value, such that every time that number of program/erase cycles occurs, a select gate integrity scan can be performed. For example, if the scan threshold value is 2000 cycles and the defined internal is 100 cycles, select gate maintenance component 113 can perform a select gate integrity scan every 100 cycles above 2000 (i.e., 2100, 2200, 2300, etc.). Thus, in one embodiment, the scan threshold condition is satisfied when the program/erase cycles meet or exceed the scan threshold value and is equal to the defined interval. If the number of program/erase cycles does not meet or exceed the scan threshold value or does not equal the defined interval, the processing logic determines that the scan threshold criterion is not satisfied, returns to operation 405, and waits to receive another request to erase the data block 200.

If the number of program/erase cycles performed on the data block 200 satisfies the scan threshold condition, at operation 430, the processing logic performs a first threshold voltage integrity scan on the data block 200 to determine a first error rate associated with a current threshold voltage of at least one select gate device SGD0 of the data block 200. During the scan, select gate maintenance component 113 identifies one or more reliability statistics, such as the raw bit error rate (RBER) representing a number of bit errors per total number of bits that the select gate experiences. In one embodiment, during the scan, select gate maintenance component 113 applies one or more read voltages to the select gate device SGD0 and receives one or more output values based on the one or more read voltages. For example, select gate maintenance component 113 reads a raw code word (i.e., a series of a fixed number of bits) from the select gate device SGD0, applies the code word to an error correcting code (ECC) decoder to generate a decoded code word, and compare the decoded code word to the raw code word (i.e., the expected output value). Select gate maintenance component 113 can count a number of flipped bits between the decoded code word and the raw code word, with a ratio of the number of flipped bits to the total number of bits in the code word representing the RBER. Select gate maintenance component 113 can repeat this process for additional code words until each of the select gate devices in data block 200 have been scanned.

At operation 435, the processing logic determines whether the first error rate associated with the current threshold voltage of the at least one select gate device SGD0 satisfies an error threshold criterion. In one embodiment, select gate maintenance component 113 compares the first error rate to an error threshold which represents an error correction capability of the memory device. If the first error rate does not meet or exceed the error threshold, the processing logic determines that the error threshold criterion is not satisfied and returns to operation 405. If, however, the first error rate does meet or exceed the error threshold, the processing logic determines that the error threshold criterion is satisfied.

If the first error rate associated with the current threshold voltage of at least one select gate device SGD0 satisfies the error threshold criterion, at operation 440, the processing logic performs a touch up operation on at least one select gate device SGD0 to adjust the current threshold voltage to the target threshold voltage. In one embodiment, select gate maintenance component 113 iteratively applies a plurality of program pulses to the at least one select gate device SGD0, to a subset of the select gate devices of data block 200, or to all of the select gate devices of data block 200, to adjust the current threshold voltage of the select gate device(s) back to the target threshold voltage. Select gate maintenance component 113 can verify, after each iteration, whether the current threshold voltage has reached the target threshold voltage, to ensure that the threshold voltage slowly steps back up to the target threshold voltage, without exceeding the target threshold voltage.

At operation 445, the processing logic performs a second threshold voltage integrity scan on the data block to determine a second error rate associated with the current threshold voltage of the at least one select gate device SGD0 of the data block 200 after performing the touch up operation and determines whether the second error rate associated with the current threshold voltage of the at least one select gate device SGD0 after performing the touch up operation satisfies the error threshold criterion. If the second error rate associated with the current threshold voltage of the at least one select gate device SGD0 after performing the touch up operation satisfies the error threshold criterion, at operation 450, the processing logic retires the data block 200. In one embodiment, the memory sub-system controller 115 adds the data block 200 to a list of retired data blocks in order to prevent new data from being written to the data block 200 in the future. If the second error rate associated with the current threshold voltage of the at least one select gate device SGD0 after performing the touch up operation does not satisfy the error threshold criterion (i.e., the error rate is below the error threshold), the processing logic returns to operation 405.

Figure 5:
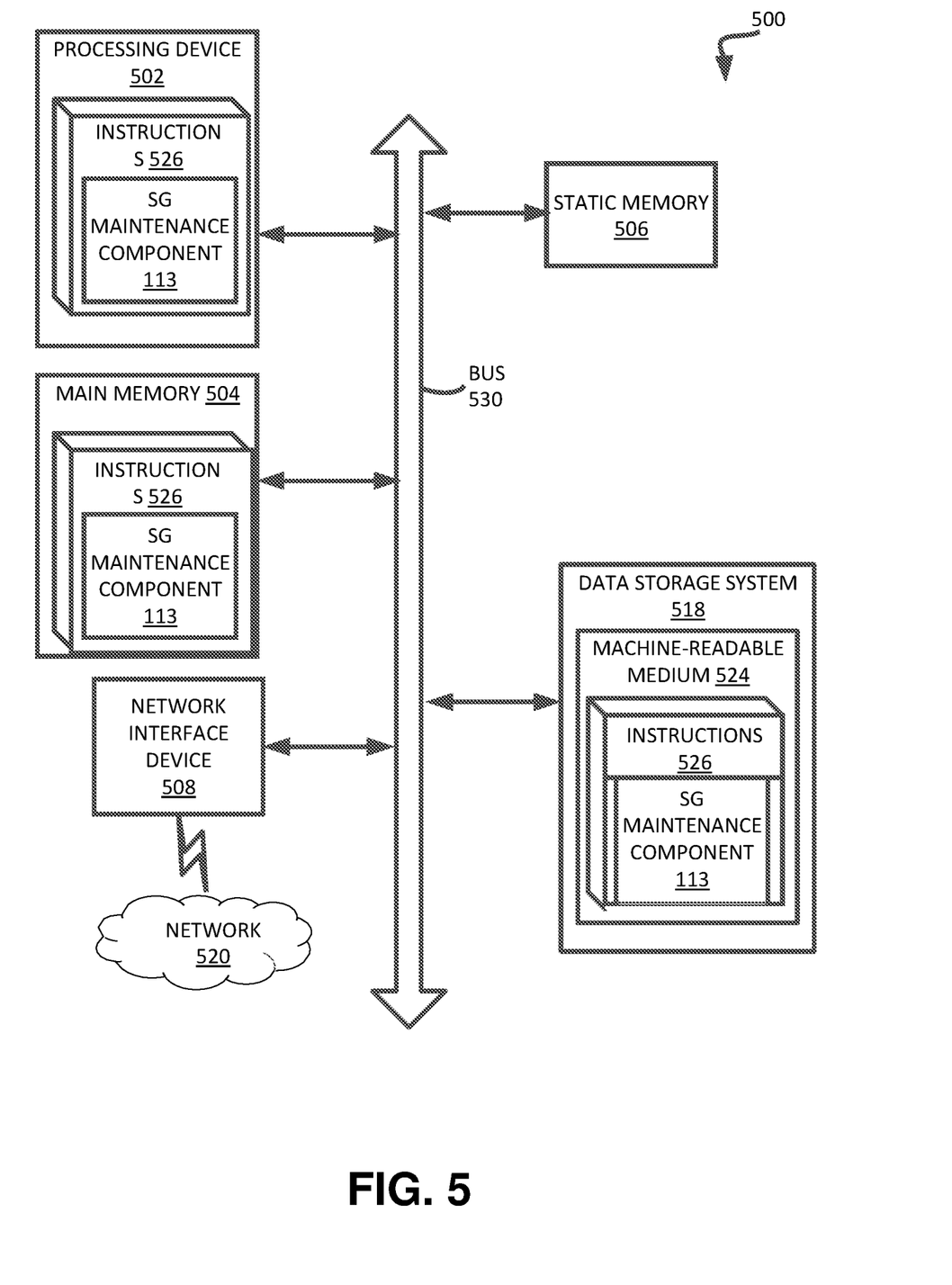
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the select gate maintenance component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to the select gate maintenance component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
   determining a first error rate associated with a current threshold voltage of at least one select gate device of a block of the memory device; and
   responsive to the first error rate associated with the current threshold voltage of the at least one select gate device satisfying an error threshold criterion, adjusting the current threshold voltage to a target threshold voltage.

2. The system of claim 1, further comprising:
performing an erase operation on the block;
determining a number of program/erase cycles performed on the block;
determining whether the erase operation was performed successfully; and
responsive to determining that erase operation was performed successfully, determining whether the number of program/erase cycles performed on the block satisfies a scan threshold criterion.

3. The system of claim 2, wherein determining whether the number of program/erase cycles performed on the block satisfies the scan threshold criterion comprises:
determining that the number of program/erase cycles performed on the block is greater than or equal to a threshold number of program/erase cycles; and
determining that the number of program/erase cycles performed on the block is equal to a defined interval for the block.

4. The system of claim 1, wherein determining the first error rate comprises performing a first threshold voltage integrity scan on the block, and wherein performing the first threshold voltage integrity scan comprises:
causing one or more read voltages to be applied to the at least one select gate device of the block;
receiving one or more output values based on the one or more read voltages; and
comparing the one or more output values to an expected output value based on the target threshold voltage.

5. The system of claim 1, wherein the processing device to perform further operations comprising:
comparing the first error rate associated with the current threshold voltage of the at least one select gate device to an error rate threshold, wherein the first error rate satisfies the error threshold criterion when the first error rate meets or exceeds the error rate threshold.

6. The system of claim 1, wherein adjusting the current threshold voltage comprises performing a touch up operation on the at least one select gate device, wherein performing the touch up operation comprises:
iteratively applying a plurality of program pulses to at least one select gate device, the plurality of program pulses to adjust the current threshold voltage to the target threshold voltage; and
verifying, after each iteration, whether the current threshold voltage has reached the target threshold voltage.

7. The system of claim 6, wherein the processing device to perform further operations comprising:
performing a second threshold voltage integrity scan on the block to determine a second error rate associated with the current threshold voltage of at least one select gate device of the block after performing the touch up operation; and responsive to the second error rate associated with the current threshold voltage of at least one select gate device after performing the touch up operation not satisfying the error threshold criterion, retiring the block.

8. A method comprising:
determining whether a number of program/erase cycles performed on a block of a memory device satisfies a threshold criterion; and
responsive to the number of program/erase cycles performed on the block satisfying the threshold criterion, adjusting a current threshold voltage of at least one select gate device to a target threshold voltage.

9. The method of claim 8, further comprising:
detecting an occurrence of a triggering event, wherein detecting the occurrence of the triggering event comprises at least one of receiving a request to erase the block or receiving a request to invalidate the block.

10. The method of claim 8, further comprising:
responsive to the number of program/erase cycles performed on the block satisfying the threshold criterion, performing a first threshold voltage integrity scan on the block to determine a first error rate associated with the current threshold voltage of at least one select gate device of the block; and
responsive to the first error rate associated with the current threshold voltage of at least one select gate device satisfying an error threshold criterion, performing a touch up operation on at least one select gate device.

11. The method of claim 8, wherein determining whether the number of program/erase cycles performed on the block satisfies the threshold criterion comprises:
determining whether the number of program/erase cycles performed on the block is greater than or equal to a threshold number of program/erase cycles; and
determining whether the number of program/erase cycles performed on the block is equal to a defined interval for the block.

12. The method of claim 10, wherein performing the first threshold voltage integrity scan on the block comprises:
applying one or more read voltages to at least one select gate device of the block;
receiving one or more output values based on the one or more read voltages; and
comparing the one or more output values to an expected output value based on the target threshold voltage.

13. The method of claim 10, wherein performing the touch up operation on at least one select gate device comprises:
iteratively applying a plurality of program pulses to at least one select gate device, the plurality of program pulses to adjust the current threshold voltage to the target threshold voltage; and
verifying, after each iteration, whether the current threshold voltage has reached the target threshold voltage.

14. The method of claim 10, further comprising:
performing a second threshold voltage integrity scan on the block to determine a second error rate associated with the current threshold voltage of at least one select gate device of the block after performing the touch up operation; and
responsive to the second error rate associated with the current threshold voltage of at least one select gate device after performing the touch up operation not satisfying the error threshold criterion, retiring the block.

15. A non-transitory computer-readable storage medium comprising instructions that, when executed by a processing device, cause the processing device to perform operations comprising:
determining a first error rate associated with a current threshold voltage of at least one select gate device of a block of a memory device; and
responsive to the first error rate associated with the current threshold voltage of the at least one select gate device satisfying an error threshold criterion, adjusting the current threshold voltage to a target threshold voltage.

16. The non-transitory computer-readable storage medium of claim 15, wherein the instructions to cause the processing device to perform further operations comprising:
performing an erase operation on the block;
determining a number of program/erase cycles performed on the block;
determining whether the erase operation was performed successfully; and
responsive to determining that erase operation was performed successfully, determining whether the number of program/erase cycles performed on the block satisfies a scan threshold criterion.

17. The non-transitory computer-readable storage medium of claim 16, wherein determining whether the number of program/erase cycles performed on the block satisfies the scan threshold criterion comprises:
determining that the number of program/erase cycles performed on the block is greater than or equal to a threshold number of program/erase cycles; and
determining that the number of program/erase cycles performed on the block is equal to a defined interval for the block.

18. The non-transitory computer-readable storage medium of claim 15, wherein determining the first error rate comprises performing a first threshold voltage integrity scan on the block, and wherein performing the first threshold voltage integrity scan comprises:
causing one or more read voltages to be applied to the at least one select gate device of the block;
receiving one or more output values based on the one or more read voltages; and
comparing the one or more output values to an expected output value based on the target threshold voltage.

19. The non-transitory computer-readable storage medium of claim 15, wherein adjusting the current threshold voltage comprises performing a touch up operation on the at least one select gate device, wherein performing the touch up operation comprises:
iteratively applying a plurality of program pulses to at least one select gate device, the plurality of program pulses to adjust the current threshold voltage to the target threshold voltage; and
verifying, after each iteration, whether the current threshold voltage has reached the target threshold voltage.

20. The non-transitory computer-readable storage medium of claim 19, wherein the instructions to cause the processing device to perform further operations comprising:
performing a second threshold voltage integrity scan on the block to determine a second error rate associated with the current threshold voltage of at least one select gate device of the block after performing the touch up operation; and
responsive to the second error rate associated with the current threshold voltage of at least one select gate device after performing the touch up operation not satisfying the error threshold criterion, retiring the block.

* * * * *